(12) United States Patent
Miyagi

(10) Patent No.: US 6,844,780 B1
(45) Date of Patent: Jan. 18, 2005

(54) AUTOMATIC GAIN CONTROL CIRCUIT

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/494,657

(22) PCT Filed: Nov. 12, 2002

(86) PCT No.: PCT/JP02/11759
§ 371 (c)(1),
(2), (4) Date: May 4, 2004

(87) PCT Pub. No.: WO03/043187

PCT Pub. Date: May 22, 2003

(30) Foreign Application Priority Data

Nov. 13, 2001 (JP) ........................................ 2001-348018

(51) Int. Cl.[7] ............................. H03G 3/20; H03G 3/10
(52) U.S. Cl. ...................................... 330/141; 330/281
(58) Field of Search ................................. 330/141, 281

(56) References Cited

U.S. PATENT DOCUMENTS 4,837,556 A * 6/1989 Matsushita et al. .... 340/310.01

6,205,095 B1 * 3/2001 Hisakado et al. ........ 369/47.25
2001/0027090 A1 * 10/2001 Uesugi ........................ 455/126
2002/0047732 A1 * 4/2002 Akahori ........................ 327/93

FOREIGN PATENT DOCUMENTS

| JP | 54-71545 | 6/1979 |
| JP | 57-192120 | 11/1982 |
| JP | 7-22880 | 1/1995 |
| JP | 7-050534 | 2/1995 |
| JP | 10-079631 | 3/1998 |

* cited by examiner

Primary Examiner—Patricia Nguyen
(74) Attorney, Agent, or Firm—Dellett & Walters

(57) ABSTRACT

An automatic gain control circuit integrally fabricated on a semiconductor substrate. An AGC circuit 17 controls the gain of an intermediate-frequency amplifier circuit 15 so that the average level of the output signal (sound signal) of an AM detector 16 may be substantially constant. The AGC circuit 17 includes a time-constant circuit 100, which comprises a charging circuit for intermittently charging the capacitor and a discharging circuit for intermittently discharging the same. By this intermittent charging and discharging of the capacitor having a small capacitance, a large time constant is set.

6 Claims, 8 Drawing Sheets

F I G. 4
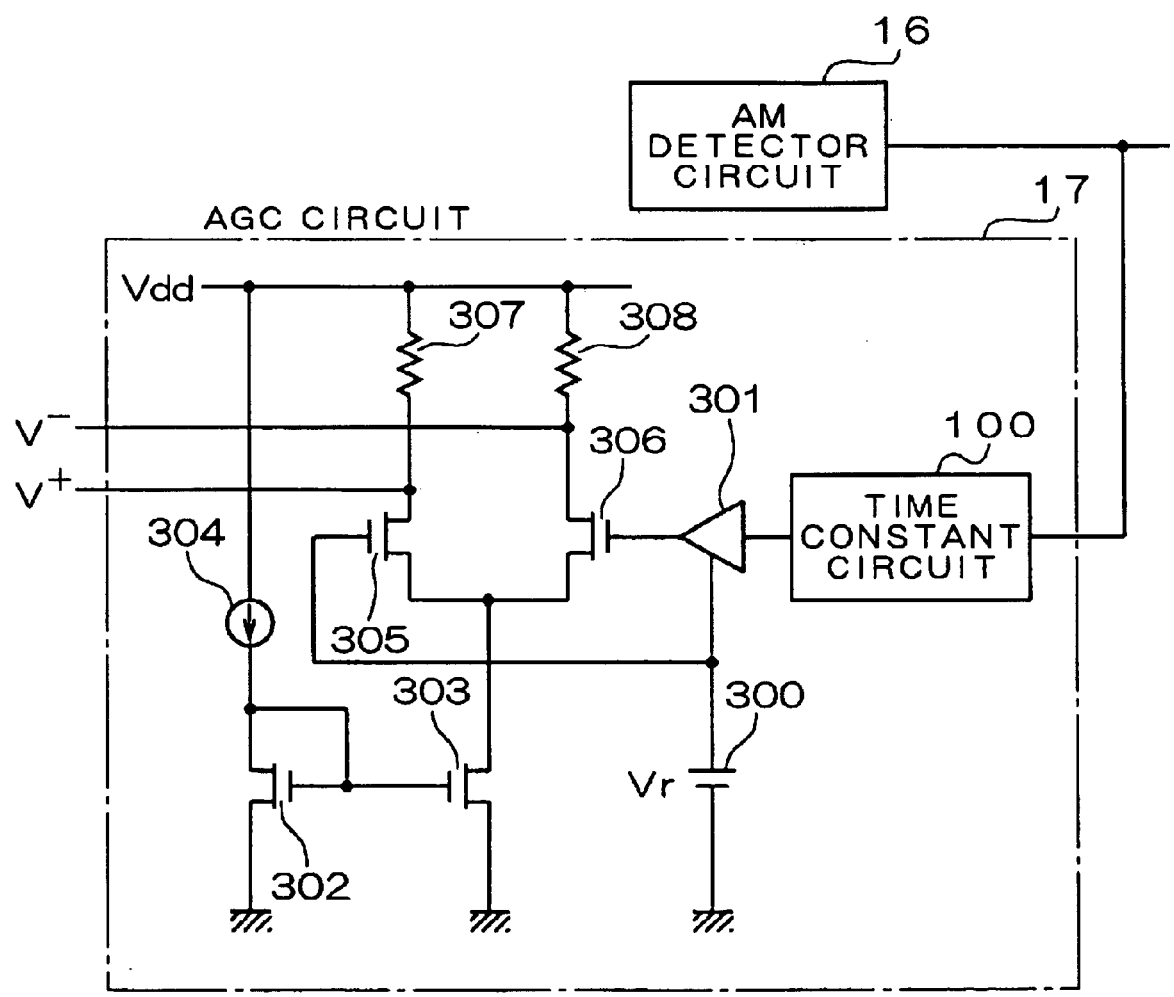

AUTOMATIC GAIN CONTROL CIRCUIT

TECHNICAL FIELD

The present invention relates to an automatic gain control circuit for controlling a gain of an amplifier included in a receiver and so on.

BACKGROUND ART

In an AM receiver or an FM receiver, an AGC (automatic gain control) circuit is used for the sake of preventing variations in an output voice level according to receiving field intensity. For instance, the AGC circuit is connected to an intermediate-frequency amplifier circuit included in the AM receiver, and the gain of the intermediate-frequency amplifier circuit is controlled according to an AM detection output. Thus, the gain of the intermediate-frequency amplifier circuit is set at a large value in a weak field area, and is inversely set at a small value in a strong field area so as to constantly obtain an almost fixed voice output.

The above-mentioned AGC circuit in the past requires a DC level to be detected by smoothing sound signals, and so a low-pass filter of a large time constant is used. To be more specific, it is necessary to set an element constant of a capacitor or a resistance constituting the low-pass filter at a large value, and there is a problem that, considering an increase in area occupied by these elements, the entire AGC circuit cannot be integrally fabricated with other circuits on a semiconductor substrate.

DISCLOSURE OF THE INVENTION

The present invention has been created in consideration of these points, and an object thereof is to provide an automatic gain control circuit integrally formable on a semiconductor substrate.

The automatic gain control circuit of the present invention is connected to an amplifier capable of adjusting a gain with a control signal, and has a time-constant circuit for smoothing an output voltage of the amplifier with a predetermined time constant and a control signal generation circuit for generating the control signal based on the output voltage of the time-constant circuit. The time-constant circuit comprises a capacitor, a voltage comparator for comparing a terminal voltage of this capacitor to an input voltage, a charging circuit for intermittently charging the capacitor in the case where the input voltage is relatively higher than the terminal voltage, a discharging circuit for intermittently emitting a discharging current from the capacitor in the case where the terminal voltage is relatively higher than the input voltage, and a charging and discharging speed setting unit for differentiating a charging speed of the charging circuit from a discharging speed of the discharging circuit. As intermittent charging and discharging are performed to the capacitor, the terminal voltage slowly changes even in the case of reducing an electrostatic capacity of the capacitor so as to equivalently set a large time constant. Therefore, it is possible, even in the case of using the capacitor of a small electrostatic capacity, to set a large time constant in the time-constant circuit in the automatic gain control circuit and integrally form the entire automatic gain control circuit on a semiconductor substrate. It is also possible, by providing the charging and discharging speed setting unit, to differentiate the charging speed from the discharging speed for the capacitor in the time-constant circuit so as to easily implement the automatic gain control circuit of which attack time and release time are different.

It is desirable to constitute the charging circuit by including a current supply section for supplying a predetermined charging current to the capacitor and a first timing control section for controlling timing of intermittent charging current supply operation by the current supply section, and to constitute the discharging circuit by including a timing emission section for emitting a predetermined discharging current from the capacitor and a second timing control section for controlling timing of intermittent discharging current emission operation by the timing emission section. It is possible to easily control intermittent discharging operation of the capacitor by controlling the timing of the charging current supply operation by the current supply section and the timing of the discharging current emission operation by the timing emission section.

It is also desirable for the above-mentioned charging and discharging speed setting unit to differentiate a time for the intermittent charging current supply and a time for the intermittent discharging current emission controlled by the first and second timing control sections. It is possible, by differentiating the times for performing the charging and discharging operations themselves, to easily differentiate the attack time and release time of the automatic gain control circuit.

In the case where each of the first and second timing control sections has a switch for controlling the timing based on a pulse signal having a predetermined duty ratio, it is desirable for the above-mentioned charging and discharging speed setting unit to differentiate the duty ratio of the pulse signal for charging from the duty ratio of the pulse signal for discharging. Thus, it becomes easy to exert control to differentiate charging time from discharging time.

It is also desirable for the above-mentioned charging and discharging speed setting unit to differentiate the charging current supplied by the current supply section from the discharging current emitted by the timing emission section. It is possible, by differentiating a charging current value from a discharging current value, to easily differentiate the attack time and release time of the automatic gain control circuit.

In the case where each of the current supply section and the timing emission section is constituted by a transistor having a predetermined reference voltage applied to a gate thereof, it is desirable for the above-mentioned charging and discharging speed setting unit to differentiate gate dimensions of a charging transistor from those of a discharging transistor. Thus, it becomes easy to exert control to differentiate the charging current value from the discharging current value.

BRIEF DESCRIPTION OF THE DRAWINGS

FIG. 4 is a circuit diagram showing the detailed configuration of the AGC circuit;

BEST MODE FOR CARRYING OUT THE INVENTION

Figure 1:
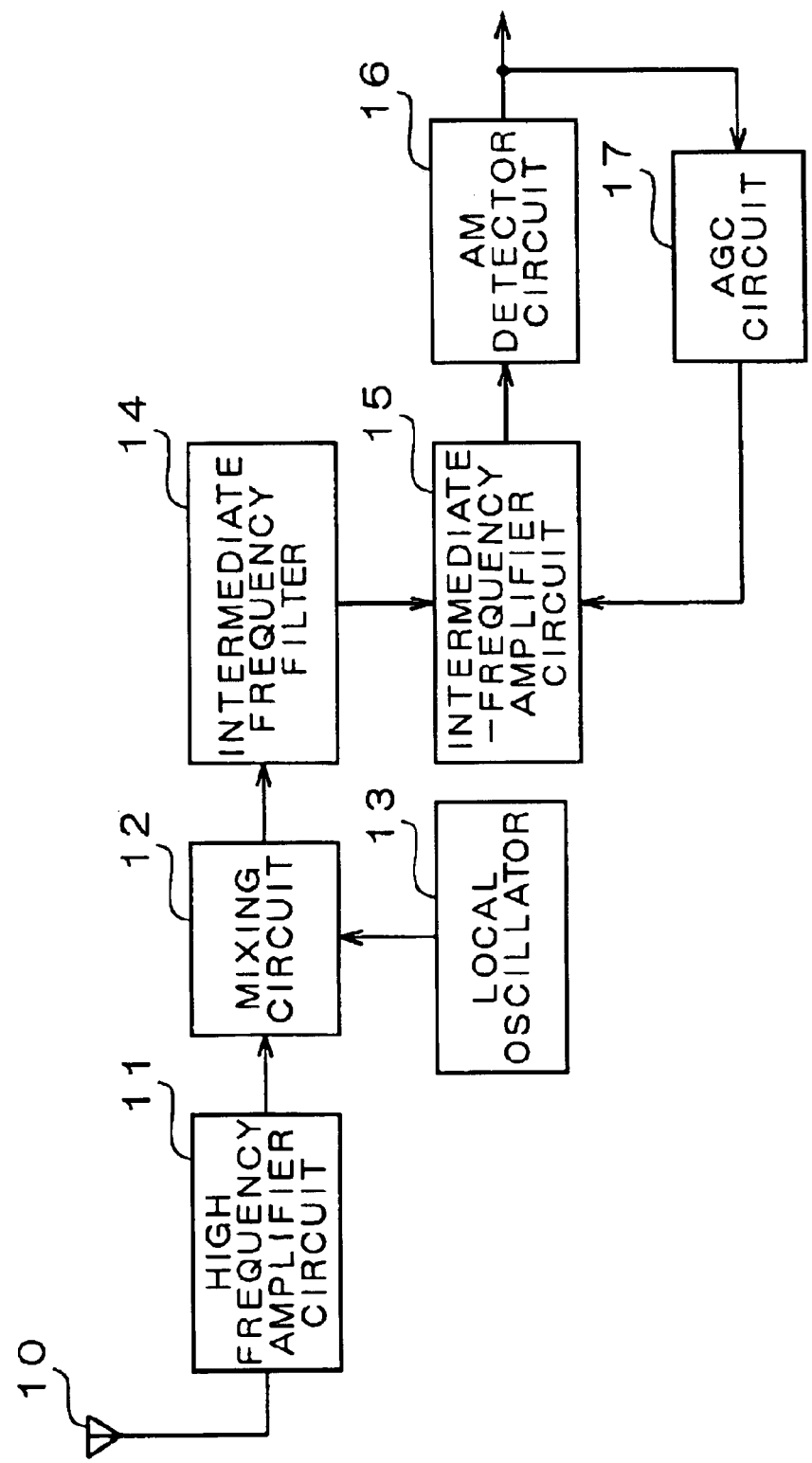
FIG. 1 is a diagram showing a configuration of an AM receiver including an AGC circuit according to an embodiment.

Hereafter, a description will be given by referring to the drawings as to an AGC circuit according to an embodiment to which the present invention is applied.

FIG. 1 is a diagram showing a configuration of an AM receiver including an AGC circuit according to an embodiment. As shown in FIG. 1, the AM receiver according to this embodiment comprises a high frequency amplifier circuit 11, a mixing circuit 12, a local oscillator 13, an intermediate frequency filter 14, an intermediate-frequency amplifier circuit 15, an AM detector circuit 16 and an AGC circuit 17. An AM modulated wave signal received by an antenna 10 is amplified by the high frequency amplifier circuit 11, and a local oscillation signal outputted from the local oscillator 13 is mixed thereafter so as to convert a high frequency signal to an intermediate frequency signal.

The intermediate frequency filter 14 is provided in a stage preceding the intermediate-frequency amplifier circuit 15, and extracts a frequency component included in a frequency bandwidth occupied by the modulated wave signal from an inputted intermediate frequency signal. The intermediate-frequency amplifier circuit 15 amplifies the intermediate frequency signal. The AM detector circuit 16 performs an AM detection process to the intermediate frequency signal amplified by the intermediate-frequency amplifier circuit 15, and outputs a sound signal. The AGC circuit 17 controls a gain of the intermediate-frequency amplifier circuit 15 so that an average level of output signals (sound signals) of the AM detector circuit 16 will become substantially constant.

Figure 2:
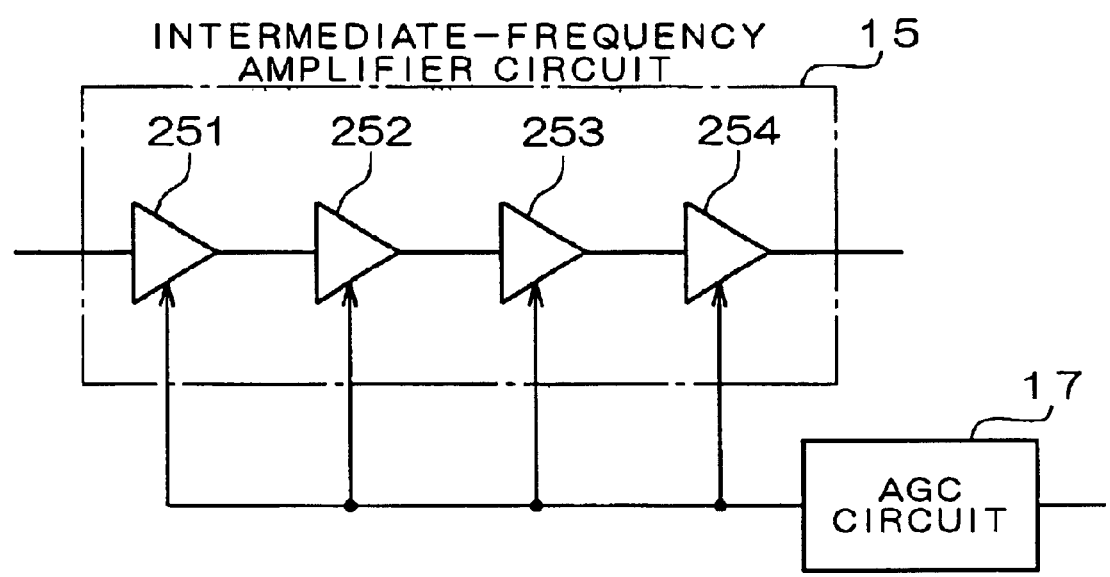
FIG. 2 is a diagram showing a configuration of an intermediate-frequency amplifier circuit.

FIG. 2 is a diagram showing the configuration of the intermediate-frequency amplifier circuit 15. As shown in FIG. 2, the intermediate-frequency amplifier circuit 15 according to this embodiment comprises cascade-connected amplifiers 251 to 254 in a plurality of stages (four stages for instance). Each of the amplifiers 251 to 254 has a predetermined gain, and the intermediate-frequency amplifier circuit 15 as a whole has the gain having the gains of the amplifiers 251 to 254 multiplied by one another. The gains of the amplifiers 251 to 254 are set by the AGC circuit 17.

Figure 3:
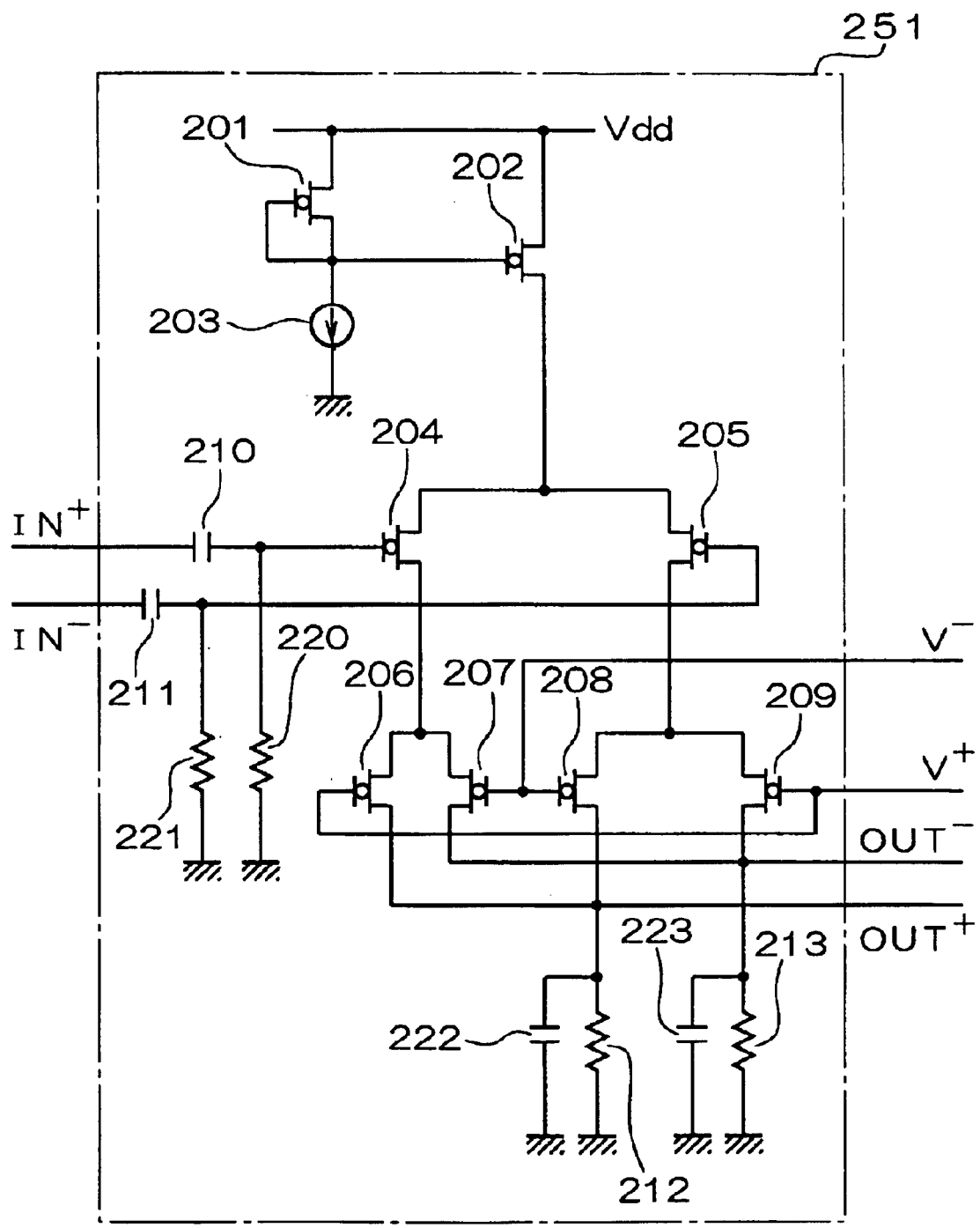
FIG. 3 is a circuit diagram showing a detailed configuration of an amplifier in each stage included in the intermediate-frequency amplifier circuit.

FIG. 3 is a circuit diagram showing a detailed configuration of the amplifier in each stage included in the intermediate-frequency amplifier circuit 15. The amplifiers 251 to 254 have the same configuration, and the following will describe the amplifier 251 in detail.

As shown in FIG. 3, the amplifier 251 according to this embodiment comprises FETs 201 and 202 for generating a constant current, a current source 203, two FETs 204 and 205 for differentially amplifying an input signal, four FETs 206, 207, 208 and 209 for varying the gains of differential outputs of the two FETs 204 and 205 along with control signals V+ and V−, two capacitors 210 and 211 for eliminating a DC component from the input signal, and two load resistances 212 and 213. The input signals (IN+, IN−) from a preceding circuit (intermediate frequency filter 14) are inputted to the FETs 204 and 205, and the control signals (V+, V−) from the AGC circuit 17 are inputted to the FETs 206 to 209. p-channel type FETs are used for all the FETs 201, 202 and 206 to 209 included in this configuration. As for resistances 220 and 221 connected to one ends of the capacitors 210 and 211 respectively, they constitute high-pass filters together with the capacitors 210 and 211, and eliminate a low frequency component including flicker noise (1/f noise) from the input signal. As for capacitors 222 and 223 connected in parallel to the resistances 212 and 213 respectively, they constitute low-pass filters together with the resistances 212 and 213, and eliminate a high frequency component including thermal noise from the output signal.

FIG. 4 is a circuit diagram showing the detailed configuration of the AGC circuit 17. As shown in FIG. 4, the AGC circuit 17 according to this embodiment comprises a time-constant circuit 100 for smoothing the input signals with a predetermined time constant, a power supply 300 for generating a predetermined power supply voltage Vr, an amplifier 301 for amplifying an output voltage of the time-constant circuit 100 with the power supply voltage Vr as an operating voltage, two FETs 302 and 303 for generating the constant current, a current source 304, two FETs 305 and 306 for differentially amplifying the power supply voltage Vr generated by the power supply 300 and the output voltage of the amplifier 301, and two resistances 307 and 308.

To smooth the output signals of the AM detector circuit 16, the time-constant circuit 100 has a response time (time constant) in the case where the output voltage rises and a response time inversely in the case where the output voltage decreases set at different values. For instance, there response time in the case where the voltage rises is set at 50 msec and the response time in the case where the voltage decreases is set at 300 to 500 msec. The amplifier 301 amplifies a smoothing output of the time-constant circuit 100, and the output voltage varies in a range of 0V to the power supply voltage Vr.

To be more specific, in the case where a voltage level of the output signals of the AM detector circuit 16 is low, the output voltage of the time-constant circuit 100 becomes low so that the output voltage of the amplifier 301 becomes a small value close to 0V. Therefore, if attention is paid to the two FETs 305 and 306 for performing differential operation, the power supply voltage Vr is applied to the gate of the one FET 305 and a low voltage close to 0V is applied to the gate of the other. FET 306, and the two control signals (V+, V−) having a large potential difference are outputted from each drain. Once the control signals are inputted to the above-mentioned amplifier 251, the differential operation is performed by the two FETs 206 and 207 or the two FETs 208 and 209, and so the gain of the entire amplifier 251 becomes high and differential output signals (OUT+, OUT−) having a large potential difference are outputted from the amplifier 251.

If the voltage level of the output voltage of the AM detector circuit becomes high, the output voltage of the time-constant circuit 100 becomes high so that the output voltage of the amplifier 301 becomes a value close to the power supply voltage Vr. Therefore, if attention is paid to the two FETs 305 and 306 for performing the differential operation, the power supply voltage Vr is applied to the gate of the one FET 305 and the power supply voltage Vr or a value close to it is applied to the gate of the other FET 306, and the two control signals (V+, V−) of substantially the same voltage level are outputted from each drain. Once the control signals are inputted to the above-mentioned amplifier 251, the differential operation is hardly performed by the two FETs 206 and 207 or the two FETs 208 and 209 any longer and so the gain of the entire amplifier 251 becomes low and differential output signals (OUT+, OUT−) having a small potential difference are outputted from the amplifier 251.

Figure 5:
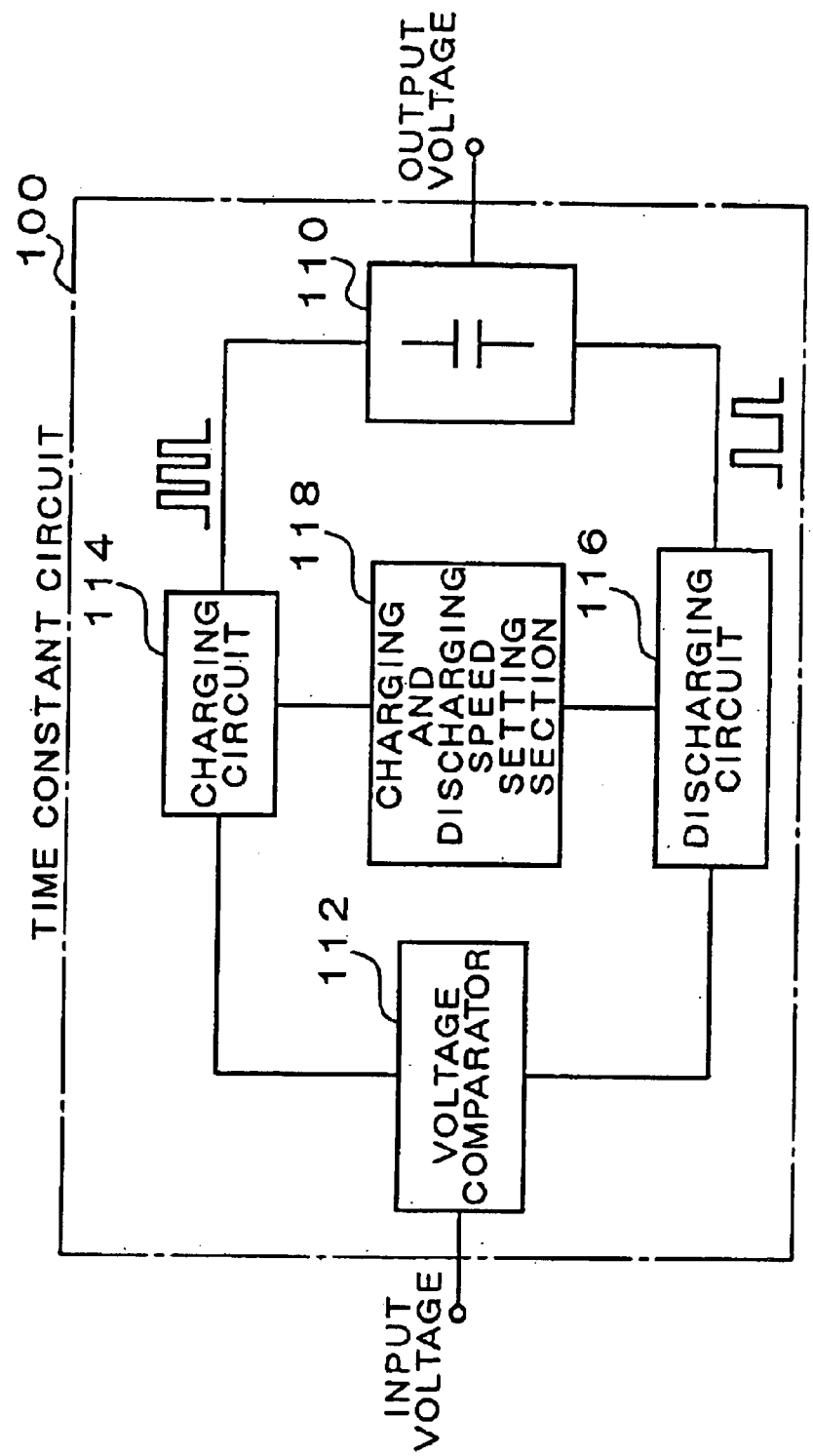
FIG. 5 is a diagram showing a principle block of a time-constant circuit.

FIG. 5 is a diagram showing a principle block of a time-constant circuit 100. As shown in FIG. 5, the time-constant circuit 100 according to this embodiment comprises a capacitor 110, a voltage comparator 112, a charging circuit 114, a discharging circuit 116 and a charging and discharging speed setting section 118. The voltage comparator 112 makes a comparison between a terminal voltage and an input voltage of the capacitor 110, and enables the operation of the charging circuit 114 or the discharging circuit 116 according to a result of this comparison. The charging circuit 114 charges the capacitor 110 by intermittently supplying the charging current. The charging circuit 114 comprises a constant current circuit and a switch for instance, and the charging current is supplied from the constant current circuit to the capacitor 110 when the switch is put in an on state. The discharging circuit 116 discharges the capacitor 110 by intermittently passing the discharging current. For instance, the discharging circuit 116 comprises the constant current circuit and the switch, and a constant current is emitted from the capacitor 110 when the switch is put in the on state. The charging and discharging speed setting section 118 makes a setting for differentiating a speed for charging the capacitor 110 with the charging circuit 114 from a speed for discharging the capacitor 110 with the discharging circuit 116. The charging and discharging speed setting section 118 is corresponding to a charging and discharging speed setting unit, and concrete contents thereof will be described later.

Thus, the time-constant circuit 100 according to this embodiment performs intermittent charging and discharging operation to the capacitor 110. For this reason, even in the case where an electrostatic capacity of the capacitor 110 is set small, the voltage at both ends thereof slowly changes so as to obtain charging and discharging characteristics equivalent to the case of using a circuit having a large time constant, that is, the capacitor having a large electrostatic capacity or a resistance having a high resistance value. The charging circuit 114 and the discharging circuit 116 exert control to supply a predetermined current to the capacitor 110 or discharge it from the capacitor 110. As such supply or discharge operation is intermittently performed, it is possible to set a current value in that case at a reasonably large value suited to being rendered IC-compatible. Therefore, it becomes possible to form the entire AGC circuit 17 including the time-constant circuit 100 on a semiconductor substrate so as to render it IC-compatible. It is also possible, as exterior parts of the capacitor and soon become unnecessary, to significantly miniaturize the entire AGC circuit 17.

The time-constant circuit 100 according to this embodiment is set by the charging and discharging speed setting section 118 so that the charging speed and the discharging speed for the capacitor 110 are different. For this reason, it is possible to differentiate the attack time and release time of the AGC circuit 17.

Figure 6:
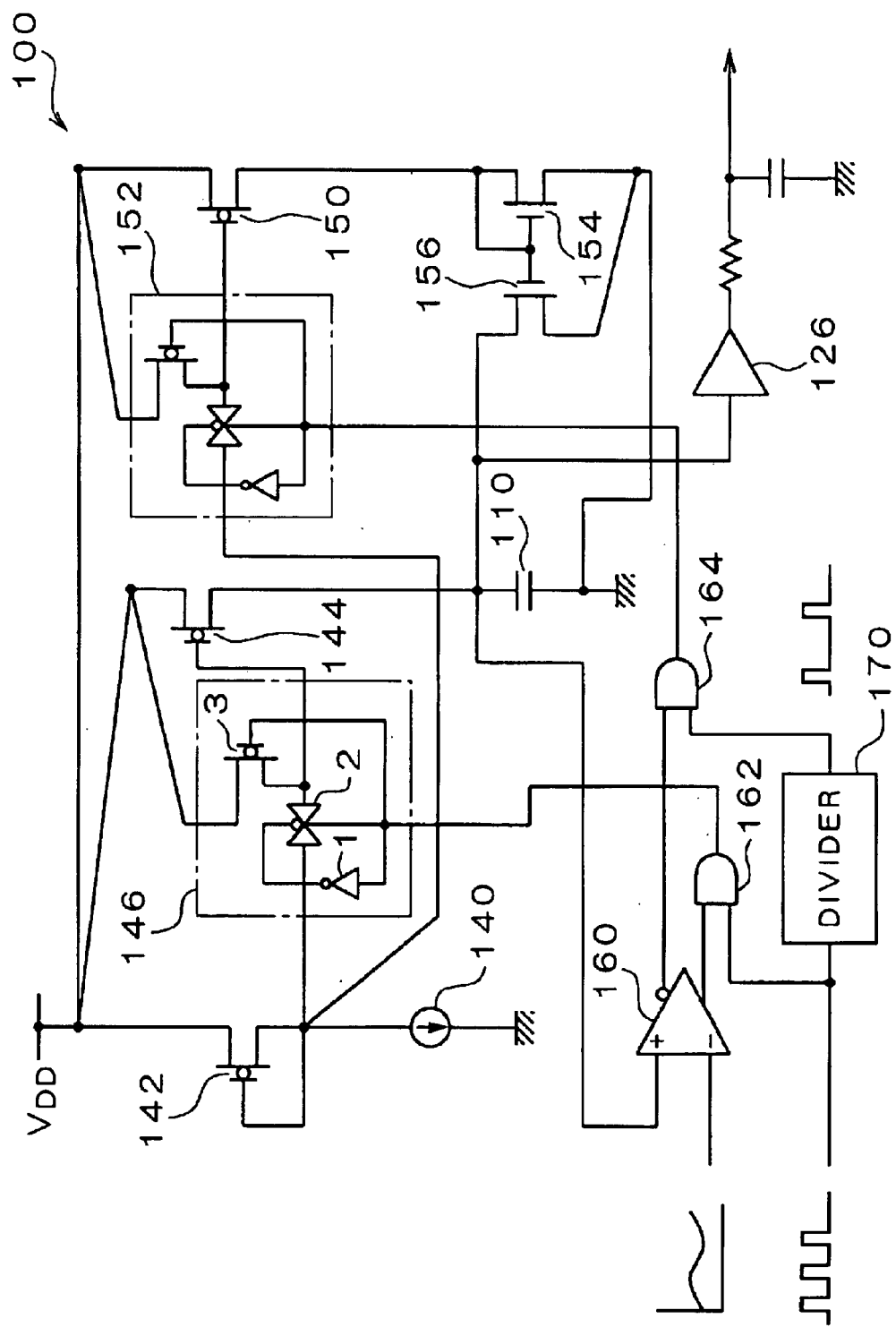
FIG. 6 is a circuit diagram showing a concrete configuration of the time-constant circuit.

FIG. 6 is a circuit diagram showing a concrete configuration of the time-constant circuit 100. As shown in FIG. 6, the time-constant circuit 100 comprises the capacitor 110, a constant current circuit 140, FETs 142, 144, 150, 154 and 156, switches 146 and 152, a voltage comparator 160, AND circuits 162 and 164, and a divider 170.

A current mirror circuit is constituted by the two FETs 142 and 144, where the same charging current as the constant current outputted from the constant current circuit 140 is generated. And generation timing of the charging current is decided by the switch 146.

The switch 146 comprises an inverter circuit 1, an analog switch 2 and an FET 3. The analog switch 2 is constituted by connecting sources and drains of a p-channel FET and an n-channel FET in parallel. The output signal of the AND circuit 162 is directly inputted to the gate of the n-channel FET, and a signal in which logic of the output signal is inverted by the inverter circuit 1 is inputted to the gate of the p-channel FET. Therefore, the analog switch 2 is put in the on state when the output signal of the AND circuit 162 is at a high level, and is inversely put in an off state when at a low level. The FET 3 is intended to securely stop the current supply operation by the FET 144 by connecting the gate and drain of the FET 144 at a low resistance when the analog switch 2 is in the off state.

If the switch 146 is put in the on state, the gate of the one FET 142 connected with the constant current circuit 140 is connected to the gate of the other FET 144. Therefore, the current which is substantially the same as the constant current generated by the constant current circuit 140 connected to the one FET 142 also runs between the source and drain of the other FET 144. This current is supplied as the charging current to the capacitor 110. Inversely, if the switch 146 is put in the off state, the gate of the FET 144 is connected to the drain so that the supply of the charging current is stopped.

The above-mentioned constant current circuit 140 and the two FETs 142 and 144 are corresponding to a current supply section. The switch 146 and the AND circuit 162 are corresponding to a first timing control section.

The current mirror circuit for setting the discharging current of the capacitor 110 is constituted by combining the above-mentioned FET 142 and the constant current circuit 140 with the FET 150, and an operating state thereof is decided by the switch 152. The switch 152 has the same configuration as the switch 146. The switch 152 has the on and off states thereof controlled according to the logic of the output signal of the AND circuit 164, where it is put in the on state when the output signal is at a high level, and is put in the off state when at a low level.

If the switch 152 is put in the on state, the gate of the one FET 142 connected with the constant current circuit 140 is connected to the gate of the other FET 150. Therefore, the current which is substantially the same as the constant current generated by the constant current circuit 140 also runs between the source and drain of the other FET 150. This current becomes the discharging current for emitting charges accumulated in the capacitor 110.

It is not possible, however, to take the current running in the FET 150 directly out of the capacitor 110. Therefore, according to this embodiment, another current mirror circuit constituted by the FETs 154 and 156 is connected to the source side of the FET 150.

The two FETs 154 and 156 have their gates mutually connected so that, on passing the above-mentioned discharging current in the FET 154, the same current also runs between the source and drain of the other FET 156. The FET 156 has the drain thereof connected to a terminal on a high potential side of the capacitor 110, and the current running in the FET 156 is generated by emitting the charges accumulated in the capacitor 110.

The above-mentioned constant current circuit 140 and the four FETs 142, 150, 154 and 156 are corresponding to a timing emission section. The switch 152 and the AND circuit 164 are corresponding to a second timing control section.

The voltage comparator 160 compares the terminal voltage of the capacitor 110 applied to a plus terminal with the input voltage of the time-constant circuit 100 applied to a minus terminal as to which of them is larger. The voltage comparator 160 has a noninverting output terminal and an inverting output terminal. In the case where the terminal voltage of the capacitor 110 applied to the plus terminal is higher than the input voltage applied to the minus terminal, a high-level signal is outputted from the noninverting output terminal and a low-level signal is outputted from the inverting output terminal. Inversely, in the case where the terminal voltage of the capacitor 110 applied to the plus terminal is lower than the input voltage applied to the minus terminal, the low-level signal is outputted from the noninverting output terminal and the high-level signal is outputted from the inverting output terminal.

The AND circuit 162 has a predetermined pulse signal inputted to one input terminal and the noninverting output terminal of the voltage comparator 160 connected to the other input terminal. Therefore, in the case where the terminal voltage of the capacitor 110 is higher than the input voltage of the time-constant circuit 100, the predetermined pulse signal is outputted from the AND circuit 162.

The AND circuit 164 has a predetermined pulse signal outputted from the divider 170 inputted to one input terminal and the inverting output terminal of the voltage comparator 160 connected to the other input terminal. Therefore, in the case where the terminal voltage of the capacitor 110 is lower than the input voltage of the time-constant circuit 100, the predetermined pulse signal is outputted from the AND circuit 164. The above-mentioned divider 170 is corresponding to the charging and discharging speed setting unit.

The divider 170 outputs the pulse signal inputted to one input terminal of the AND circuit 162 after dividing it at a predetermined dividing ratio. As described above, the pulse signal after the dividing is inputted to one input terminal of the AND circuit 164.

The time-constant circuit 100 has such a configuration, and the operation thereof will be described below.

In the case where the capacitor 110 is not charged on starting the operation of the time-constant circuit 100, or in the case where the input voltage of the time-constant circuit 100 (output voltage of the AM detector circuit 16) is on an upward trend, the terminal voltage of the capacitor 110 is lower than the input voltage of the time-constant circuit 100. In this case, the pulse signal is outputted from the AND circuit 162, and no pulse signal is outputted from the AND circuit 164. Therefore, only the switch 146 is intermittently put in the on state, and a predetermined charging current is supplied to the capacitor 110 in the timing for being put in the on state. This charging operation is continued until the terminal voltage of the capacitor 110 becomes relatively higher than the input voltage of the time-constant circuit 100.

In the case where, because of this charging operation, the terminal voltage of the capacitor 110 exceeds the input voltage of the time-constant circuit 100, or in the case where the input voltage is on a downward trend and is lower than the terminal voltage of the capacitor 110, the pulse signal is outputted from the AND circuit 164 and no pulse signal is outputted from the AND circuit 162. Therefore, only the switch 152 is intermittently put in the on state, and a predetermined discharging current is emitted from the capacitor 10 in timing for being put in the on state. This discharging operation is continued until the terminal voltage of the capacitor 110 becomes relatively lower than the input voltage of the time-constant circuit 100.

If the two kinds of pulse signals outputted from the AND circuits 162 and 164 are compared, the duty ratio of the pulse signals outputted from the AND circuit 162 is higher than the duty ratio of the pulse signals outputted from the AND circuit 164. Therefore, considering the case where the pulse signals are outputted for the same time from each of the two AND circuits 162 and 164, the charging speed per unit time is faster than the discharging speed. For this reason, the attack time of the AGC circuit 17 is shorter than the release time thereof.

The above-mentioned time-constant circuit 100 uses the divider 170 for the sake of outputting the pulse signals of different duty ratios from the two AND circuits 162 and 164. It is also possible, however, to generate the pulse signals of different duty ratios separately so as to input them to the two AND circuits 162 and 164 respectively.

The above-mentioned time-constant circuit 100 has different ratios per unit time for the FETs 144 and 150 to be put in the on state respectively for the sake of differentiating the charging speed and the discharging speed for the capacitor 110. It is also possible, however, to differentiate the charging current and the discharging current themselves by differentiating the gate dimensions of the FETs.

Figure 7:
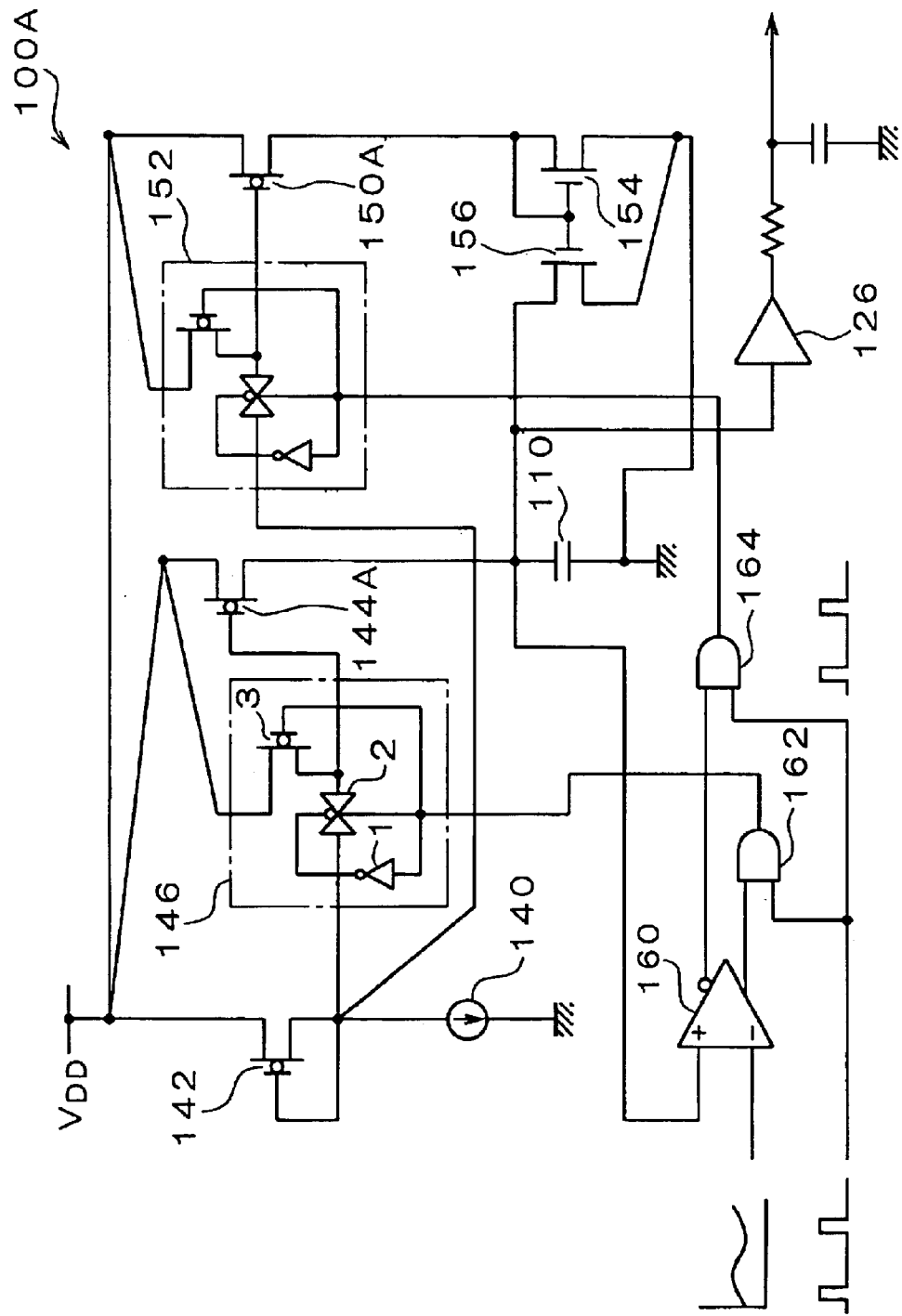
FIG. 7 is a circuit diagram showing a modified example of the time-constant circuit.

FIG. 7 is a circuit diagram showing a modified example of the time-constant circuit. A time-constant circuit 100A shown in FIG. 7 is different from the time-constant circuit 100 shown in FIG. 6 in that the divider 170 is deleted, and the two FETs 144 and 150 are changed to two FETs 144A and 150A by changing the gate dimensions.

Figure 8:
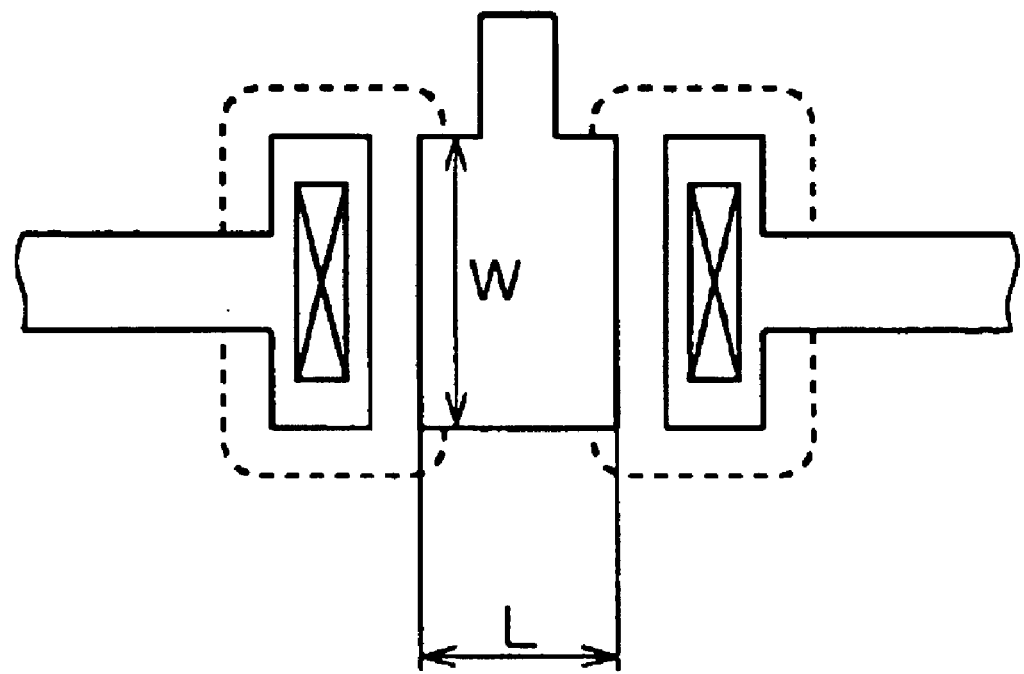
FIG. 8 is a diagram showing gate dimensions of an MOS-type FET.

FIG. 8 is a diagram showing the gate dimensions of an MOS-type FET (FET). Even if a gate voltage is the same, a channel resistance is changed by modifying a gate width W and a gate length L so that the current running between the source and drain changes. According to this embodiment, the gate width W of the FET 144A is set at a large value and the gate length L thereof is set at a small value in order to increase the charging current and reduce the attack time. And the gate width W of the FET 150A is set at a small value and the gate length L thereof is set at a large value in order to decrease the discharging current and extend the release time. Thus, it is possible, by differentiating the gate dimensions of the FETs 144A and 150A respectively, to easily differentiate the attack time and the release time of the AGC circuit 17. In this case, the FETs 144A and 150A constitute a part of the configuration of the charging circuit 114 and the discharging circuit 116, and also have a function as the charging and discharging speed setting unit.

The present invention is not limited to the above embodiment but allows various modified embodiments in the range of the scope of the invention. For instance, the above-mentioned embodiment described the AGC circuit 17 for controlling the gain of the intermediate-frequency amplifier circuit 15 included in the AM receiver. It is also possible, however, to apply the present invention to the AGC circuit for controlling the gains of the intermediate-frequency amplifier circuit or other various circuits included in an FM receiver and so on.

INDUSTRIAL APPLICABILITY

As described above, according to the present invention, it is possible, as intermittent charging and discharging are performed to the capacitor, to slowly change the terminal voltage even in the case of reducing the electrostatic capacity of the capacitor so as to equivalently set the large time constant. Therefore, it is possible, even in the case of using the capacitor of a small electrostatic capacity, to set the large time constant in the time-constant circuit in the automatic gain control circuit and integrally form the entire automatic gain control circuit on the semiconductor substrate. It is also possible, by providing the charging and discharging speed setting unit, to differentiate the charging speed from the discharging speed for the capacitor in the time-constant circuit so as to easily implement the automatic gain control circuit of which attack time and release time are different.

What is claimed is:

1. An automatic gain control circuit connected to an amplifier capable of adjusting a gain with a control signal and having a time-constant circuit for smoothing an output voltage of said amplifier with a predetermined time constant and a control signal generation circuit for generating said control signal based on the output voltage of said time-constant circuit, characterized in that said time-constant circuit comprises:

a capacitor;

a voltage comparator for comparing a terminal voltage of said capacitor to an input voltage;

a charging circuit for intermittently charging said capacitor in the case where said input voltage is relatively higher than said terminal voltage;

a discharging circuit for intermittently emitting a discharging current from said capacitor in the case where said terminal voltage is relatively higher than said input voltage; and a charging and discharging speed setting unit for differentiating a charging speed of said charging circuit from a discharging speed of said discharging circuit.

2. The automatic gain control circuit according to claim 1, characterized in that:

said charging circuit comprises a current supply section for supplying a predetermined charging current to said capacitor and a first timing control section for controlling timing of intermittent charging current supply operation by said current supply section; and said discharging circuit comprises a timing emission section for emitting a predetermined discharging current from said capacitor and a second timing control section for controlling timing of intermittent discharging current emission operation by said timing emission section.

3. The automatic gain control circuit according to claim 2, characterized in that said charging and discharging speed setting unit differentiates a time for the intermittent charging current supply and a time for the intermittent discharging current emission controlled by said first and second timing control sections.

4. The automatic gain control circuit according to claim 3, characterized in that each of said first and second timing control sections has a switch for controlling said timing based on a pulse signal having a predetermined duty ratio, and said charging and discharging speed setting unit differentiates a duty ratio of said pulse signal for charging from the duty ratio of said pulse signal for discharging.

5. The automatic gain control circuit according to claim 2, characterized in that said charging and discharging speed setting unit differentiates the charging current supplied by said current supply section from the discharging current emitted by said timing emission section.

6. The automatic gain control circuit according to claim 5, characterized in that each of said current supply section and said timing emission section is constituted by a transistor having a predetermined reference voltage applied to a gate thereof; and said charging and discharging speed setting unit differentiates gate dimensions of said transistor for charging transistor for discharging.

* * * * *